(12) United States Patent
Kim et al.

(10) Patent No.: US 9,692,017 B2
(45) Date of Patent: Jun. 27, 2017

(54) ORGANIC LIGHT EMITTING DIODE AND DISPLAY DEVICE HAVING ENHANCED VIEWING ANGLES

(71) Applicant: LG DISPLAY CO., LTD., Seoul (KR)

(72) Inventors: Ho-Sung Kim, Suwon-si (KR); Mi-Na Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 122 days.

(21) Appl. No.: 14/698,473

(22) Filed: Apr. 28, 2015

(65) Prior Publication Data
US 2015/0333295 A1    Nov. 19, 2015

(30) Foreign Application Priority Data

May 14, 2014  (KR) ........................ 10-2014-0057717

(51) Int. Cl.
| | | |
|---|---|---|
| H01L 29/08 | (2006.01) | |
| H01L 51/52 | (2006.01) | |
| H01L 51/50 | (2006.01) | |
| H01L 27/32 | (2006.01) | |

(52) U.S. Cl.
CPC ...... H01L 51/5278 (2013.01); H01L 27/3211 (2013.01); H01L 51/504 (2013.01); H01L 51/5012 (2013.01); H01L 51/5056 (2013.01); H01L 51/5068 (2013.01); H01L 51/5206 (2013.01); H01L 51/5221 (2013.01); H01L 51/5265 (2013.01); *H01L 27/3244* (2013.01); *H01L 2251/558* (2013.01)

(58) Field of Classification Search
CPC ............. H01L 51/5278; H01L 51/5012; H01L 51/504; H01L 51/5056; H01L 51/5068; H01L 51/5206; H01L 51/5221; H01L 51/5265; H01L 27/3211
See application file for complete search history.

(56) References Cited

U.S. PATENT DOCUMENTS

| | | | |
|---|---|---|---|
| 2003/0034938 A1* | 2/2003 | Yamada | .............. H01L 51/5265 345/76 |
| 2007/0069996 A1 | 3/2007 | Kuba et al. | |
| 2007/0252520 A1* | 11/2007 | Hasegawa | .............. C09K 11/06 313/504 |

FOREIGN PATENT DOCUMENTS

| | | |
|---|---|---|
| CN | 1396791 A | 2/2003 |
| EP | 2442622 A1 | 4/2012 |
| KR | 10-2012-0039401 A | 4/2012 |
| KR | 10-2013-0048965 A | 5/2013 |

* cited by examiner

*Primary Examiner* — Matthew Gordon
(74) *Attorney, Agent, or Firm* — Birch, Stewart, Kolasch & Birch, LLP (57) ABSTRACT

An organic light emitting diode can include a first electrode and a second electrode; an organic light emitting layer between the first electrode and the second electrode; and a auxiliary light emitting layer between the first electrode and the organic light emitting layer or between the organic light emitting layer and the second electrode, wherein a difference between a main peak wavelength of light emitted from the organic light emitting layer itself and a main peak wavelength of light out-coupling between the first and second electrodes is within a predetermined range.

14 Claims, 9 Drawing Sheets

ORGANIC LIGHT EMITTING DIODE AND DISPLAY DEVICE HAVING ENHANCED VIEWING ANGLES

CROSS REFERENCE TO RELATED APPLICATIONS

The present application claims the priority benefit of Korean Patent Application No. 10-2014-0057717 filed in the Republic of Korea on May 14, 2014, which is hereby incorporated by reference for all purposes as if fully set forth herein.

BACKGROUND OF THE INVENTION

Field of the Invention

The invention relates to an organic light emitting diode and a display device including the same that improve a display quality by minimizing color inversion and color shift according to viewing angles.

Discussion of the Related Art

As one of display devices, an organic light emitting diode (OLED) display device, which may be referred to as an organic electroluminescent display device, has high brightness and low driving voltage. In addition, because it is self-luminous, the OLED display device has an excellent contrast ratio and an ultra thin thickness, and has a response time of several micro seconds, and thus there are advantages in displaying moving images without delays. The OLED display device is stable under low temperatures and since the OLED display device is driven by low voltage of direct current (DC) 5V to 15V, it is easy to design and manufacture driving circuits. Accordingly, the OLED display device is widely used for various information technology (IT) devices such as a television, a monitor, a mobile phone, and so on.

Hereinafter, a structure of an OLED display device will be described in more detail.

Figure 1:
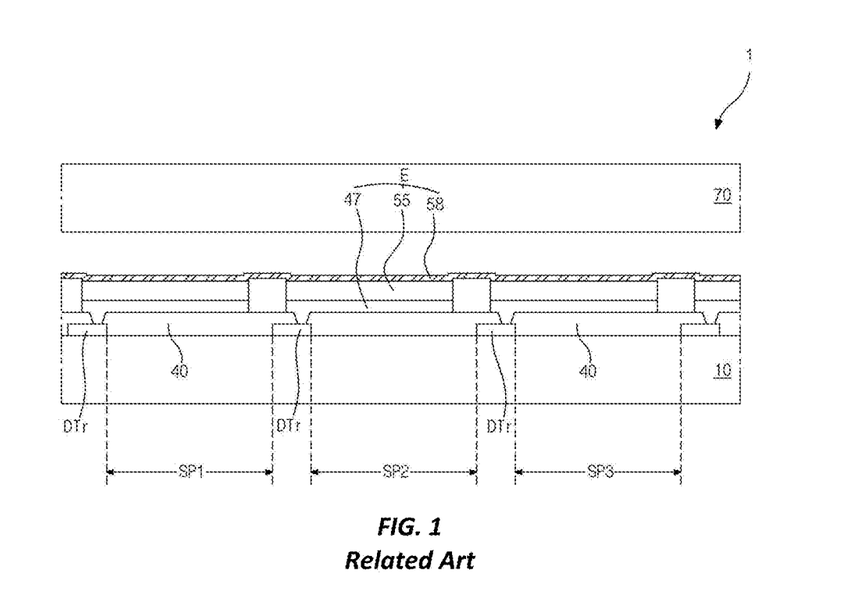
FIG. 1 is a cross-sectional view of schematically illustrating a pixel region of an OLED display device according to the related art.

FIG. 1 is a cross-sectional view of schematically illustrating a pixel region of an organic light emitting diode (OLED) display device according to the related art.

In FIG. 1, the OLED display device 1 according to the related art includes a first substrate 10 having an array element and organic light emitting diodes E and a second substrate 70 for encapsulation opposite to the first substrate 10.

The array element on the first substrate 10 includes switching thin film transistors (not shown) connected to gate and data lines (not shown) and driving thin film transistors DTr connected to the organic light emitting diodes E. Each of the organic light emitting diodes E includes a first electrode 47 connected to the driving thin film transistor DTr, an organic light emitting layer 55 and a second electrode 58.

The organic light emitting layer 55 includes an organic light emitting material that emits red, green and blue in respective sub pixels SP1, SP2 and SP3.

Light emitted from the organic light emitting layer 55 is outputted through the first electrode 47 or the second electrode 58, and thus the OELD display device 1 displays an image.

Meanwhile, in the OLED display device 1 having the above-mentioned structure, a microcavity effect is used to improve luminous efficiency and color purity of a displayed image.

The microcavity effect is a phenomenon where the light emitted from the organic light emitting layer 55 is repeatedly and selectively reflected between specific layers and is transmitted with changed spectrum and increased optical intensity through the first electrode 47 or the second electrode 58 to thereby improve the color purity and brightness of light finally outputted.

However, the brightness of light emitted by the OLED display device using the microcavity effect decreases as a viewing angle increases, and the main peak wavelength of light shifts from a long wavelength to a short wavelength to cause a color shift. Here, the viewing angle is defined as zero degree when a user views the image at the front and increases as a viewing point of the user goes to a side with respect to the front. The viewing angle is within a range of 0 to 90 degrees up and down and left and right with respect to the front.

Figure 2:
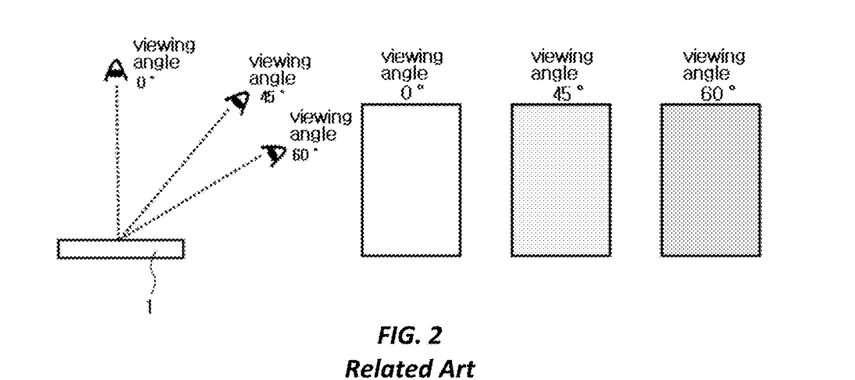
FIG. 2 is a view illustrating color shifts according to viewing angles in a pixel including red, green and blue sub pixels of the related art OLED display device when a white image is displayed.

FIG. 2 is a view illustrating color shifts according to viewing angles in a pixel including red, green and blue sub pixels of the related art OLED display device when a white image is displayed.

In FIG. 2, when the user views the image of the OLED display device 1 at the viewing angle of zero, normal white is displayed and viewed. On the other hand, when the user views the image at the viewing angles of 45 degrees and 60 degrees, color coordinates are shifted, and white different from the normal white is displayed and viewed. Namely, as the viewing angle increases, the brightness of light emitted by the OLED display device 1 is decreased, and the main peak wavelength of the light emitted by the OLED display device 1 is shifted. Thus, the color of an image viewed at a predetermined angle, for example, 45 degrees or 60 degrees as shown in FIG. 2, is different from the color of the image viewed at the front (e.g., at 0 degrees), which is problematic.

Figure 3:
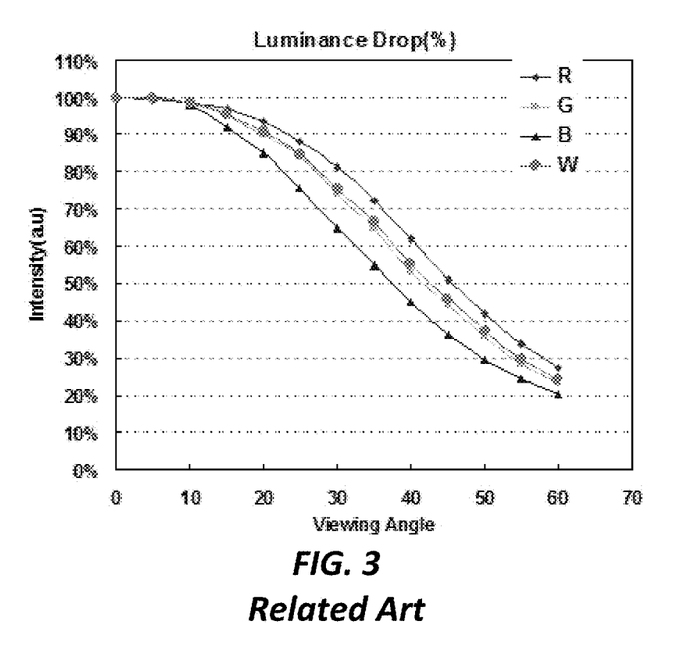
FIG. 3 is a graph illustrating changes of brightness according to viewing angles of 0 to 80 degrees in the related art OLED display device.

FIG. 3 is a graph illustrating changes of brightness according to viewing angles of 0 to 80 degrees in the related art OLED display device.

In FIG. 3, when an image is viewed at the front and the viewing angle is 0, the brightness is 100%. As the viewing angle is changed from 0 degree to 60 degrees, the brightness of red, green, blue, and white light is gradually lowered.

For example, while the white light has the brightness of 100% at 0 degree, the white light has the brightness of about 24% at the viewing angle of 60 degrees. In addition, while the red, green and blue light has the brightness of 100% at the viewing angle of 0 degree, the red, green and blue light has the brightness of about 28%, 23% and 20% at the viewing angle of 60 degrees, respectively.

In this manner, the brightness of each color light is lowered, and a color coordinate value of each color light is also changed in the related art OLED display devices.

For instance, in the related art OLED display device 1, the brightness is lowered as the viewing angle increases, and the color shift occurs, thereby causing a change of the color coordinate. Therefore, there is a problem that the display quality is lowered in the related art OLED display devices according to the changes of the viewing angle

SUMMARY OF THE INVENTION

Accordingly, the present invention is directed to an organic light emitting diode and a display device including the same that substantially obviate one or more of the problems due to limitations and disadvantages of the related art.

An advantage of one of more embodiments of the present invention is to provide an organic light emitting diode and a display device including the same that minimize changes of brightness and color coordinates depending on the change of the viewing angles and prevent or minimize the display quality from being lowered according to the viewing angles.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

In accordance with an embodiment of the present invention, as embodied and broadly described herein, an organic light emitting diode can include a first electrode and a second electrode; an organic light emitting layer between the first electrode and the second electrode; and an auxiliary light emitting layer between the first electrode and the organic light emitting layer or between the organic light emitting layer and the second electrode, wherein a difference between a main peak wavelength of light emitted from the organic light emitting layer itself and a main peak wavelength of light out-coupling between the first and second electrodes is within a range of −14 nm to −2 nm.

In another aspect, a display device can include an organic light emitting diode including two electrodes and an organic light emitting layer therebetween, wherein, to dispose a maximum peak at a curve of a color coordinate variation rate (Δu'v') of the organic light emitting diode within a range of viewing angles of −80 degrees to +80 degrees, a thickness of the organic light emitting diode is optimized such that a main peak wavelength of light out-coupling between the two electrodes has a larger value than a main peak wavelength of light emitted from the organic light emitting layer itself.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to the preferred embodiments, examples of which are illustrated in the accompanying drawings.

Advantages and features of the present invention and methods of accomplishing the same may be understood more readily by reference to the following detailed description of exemplary embodiments and the accompanying drawings. However, the present invention will be embodied in many different forms and is not limited to the embodiments set forth herein. Rather, these embodiments are provided to complete the disclosure of the present invention and to completely convey the concept of the invention to one of skill in the art, and the present invention will be defined only by a category of claims.

Shapes, sizes, rates, angles, numbers, etc. as disclosed in the drawings for explaining the embodiments of the present invention are illustrative and are not limited to the details shown. The same reference numerals throughout the specification refer to the same elements. Additionally, in the following description of the present invention, a detailed description of the well-known technique that is determined to unnecessarily obscure the subject matter of the present invention will be omitted.

In cases that "include", "have", "comprise", etc. are mentioned on this specification, other parts may be added unless "only" is used together. The term of the component used in the singular without specific mention includes plural ones.

Interpretation of the component includes a margin of error even if there is no clear description.

When the description of the positional relationship between two parts includes 'on', 'over', 'under', 'beside', etc., one or more parts may be positioned between the two parts unless "right" or "direct" is used.

When the description of the time sequential relation includes 'after', 'followed by, 'next', 'before', etc., non-continuous cases may be included unless "right" or "direct" is used.

The first, second, etc. may be used to describe these various components, but these components are not limited by these terms. These terms are only used to distinguish one element to the other components. Thus, the first component referred to below may be a second component within the scope of the present invention.

Characteristics of the various embodiments of the present invention may be partially or fully coupled to or combined with each other and may be technically variously linked and driven, and each of the embodiments may be performed independently with respect to each other and be carried together in relation with each other.

Hereinafter, embodiments of the present invention will be described in detail with reference to accompanying drawings.

Figure 4:
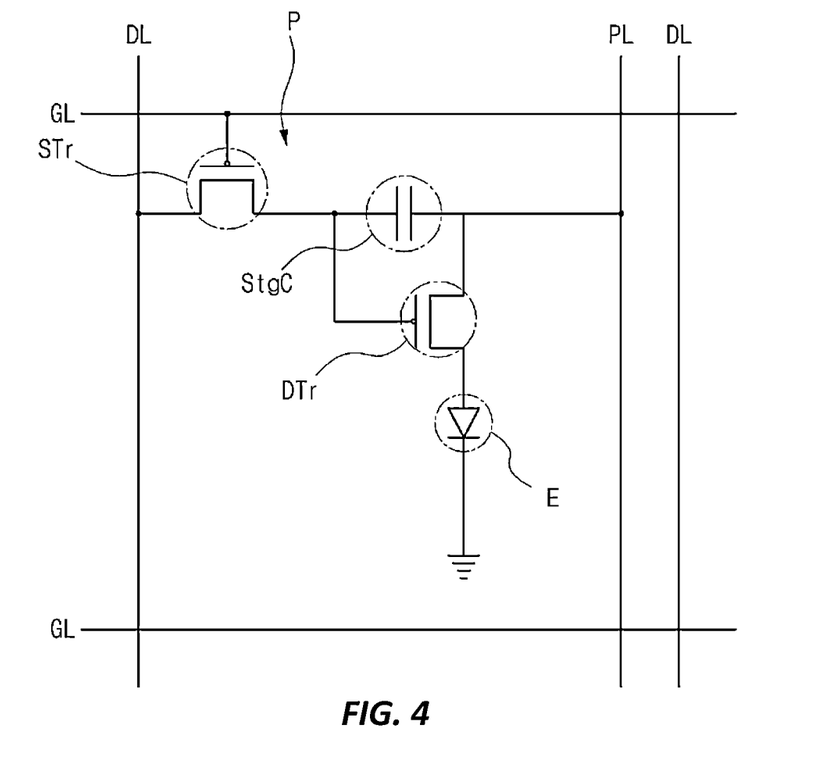
FIG. 4 is a circuit diagram of one pixel region of an OLED display device according to an embodiment of the present invention.

First, a structure and operation of an OLED display device will be described with reference to FIG. 4. FIG. 4 is a circuit diagram of one pixel region of an OLED display device according to an embodiment of the present invention.

As shown in FIG. 4, an OLED display device includes a switching thin film transistor STr, a driving thin film transistor DTr, a storage capacitor StgC and an organic light emitting diode E in each pixel region P, which corresponds to a sub pixel of a pixel.

A gate line GL is formed in a first direction and a data line DL is formed in a second direction crossing the first direction to define the pixel region P. A power line PL for providing a power source voltage is formed to be parallel to and spaced apart from the data line DL.

The switching thin film transistor STr is connected to the gate and data lines GL and DL at a crossing portion of the gate and data lines GL and DL, and the driving thin film transistor DTr is electrically connected to the switching thin film transistor STr.

A first electrode as one terminal of the organic light emitting diode E is connected to a drain electrode of the driving thin film transistor DTr, and a second electrode as the other terminal of the organic light emitting diode E is grounded. At this time, the power line PL provides the power source voltage to the organic light emitting diode E. In addition, the storage capacitor StgC is formed between a gate electrode and a source electrode of the driving thin film transistor DTr.

When the switching thin film transistor STr is turned on by a gate signal applied through the gate line GL, a data signal from the data line DL is applied to the gate electrode of the driving thin film transistor DTr and an electrode of the storage capacitor StgC. When the driving thin film transistor DTr is turned on by the data signal, an electric current is supplied to the organic light emitting diode E from the power line PL. As a result, the organic light emitting diode E emits light. In this case, when the driving thin film transistor DTr is turned on, a level of an electric current applied from the power line PL to the organic light emitting diode E is determined such that the organic light emitting diode E can produce a gray scale. The storage capacitor StgC serves to maintain the voltage of the gate electrode of the driving thin film transistor DTr when the switching thin film transistor STr is turned off. Accordingly, even if the switching thin film transistor STr is turned off, a level of an electric current applied from the power line PL to the organic light emitting diode E is maintained until a next frame.

Figure 5:
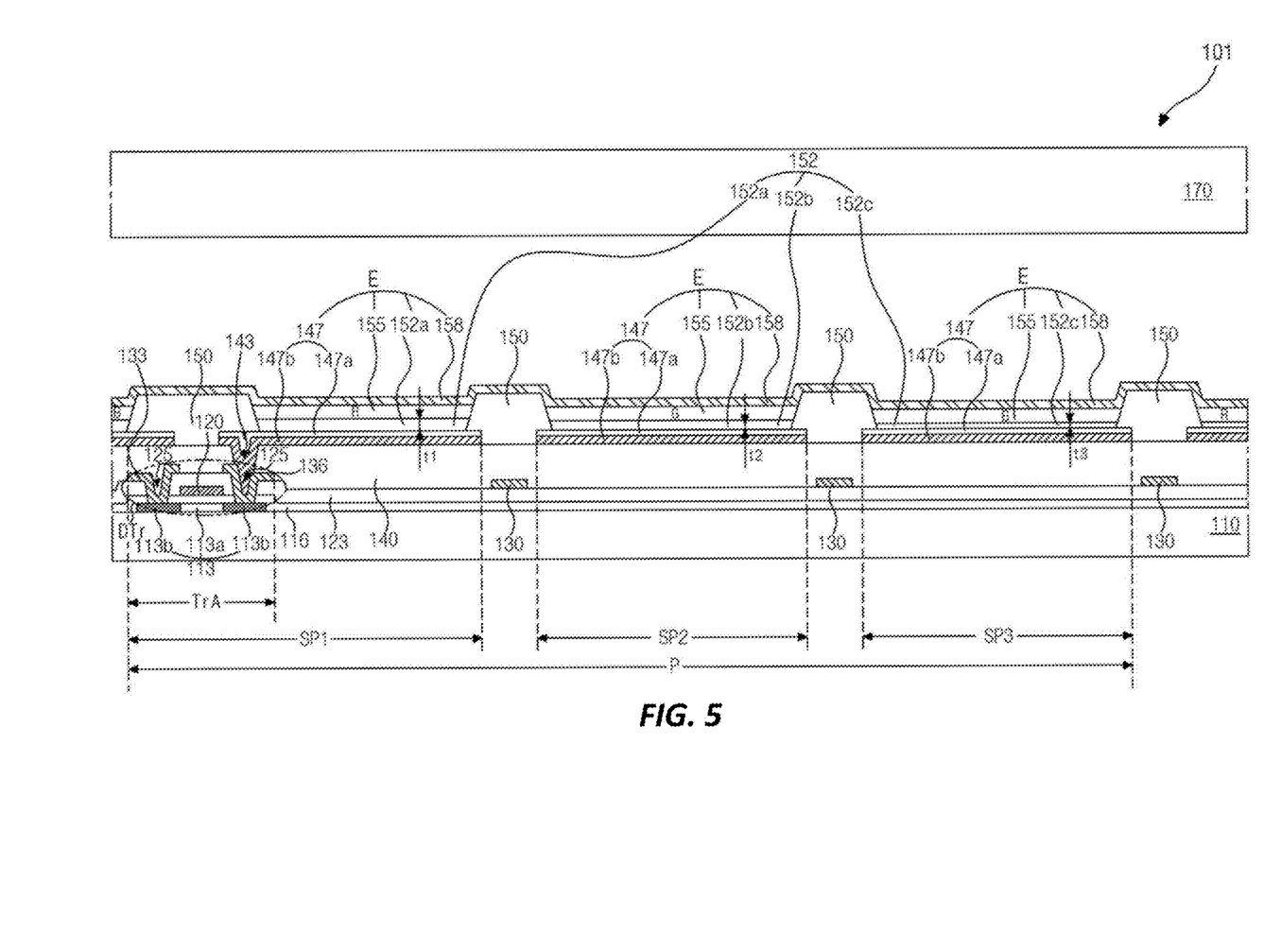
FIG. 5 is a cross-sectional view of partially illustrating a display area of an OLED display device according to an embodiment of the present invention.

FIG. 5 is a cross-sectional view of partially illustrating a display area of an OLED display device according to an embodiment of the present invention, and FIG. 5 shows a pixel P including first, second and third sub pixels SP1, SP2 and SP3. For convenience of explanation, a transistor area TrA where a driving thin film transistor DTr is formed is defined, and although the transistor area TrA is shown only in the first sub pixel SP1, the transistor area TrA is defined in each of the sub pixels SP1, SP2 and SP3. In addition, although not shown in the figure, a switching thin film transistor is also formed in each transistor area TrA.

As shown in FIG. 5, an OLED display device 101 according to the embodiment of the present invention includes a first substrate 110, where the driving thin film transistor DTr, the switching thin film transistor (not shown) and an organic light emitting diode E are formed, and a second substrate 170 for encapsulation. The second substrate 170 may be replaced by an inorganic insulating film and/or an organic insulating film, which may have a multiple-layered structure, or may be omitted by attaching a film to the first substrate 110 with a face seal.

First, the first substrate 110 including the driving thin film transistor DTr, the switching thin film transistor (not shown) and the organic light emitting diode E will be described.

A semiconductor layer 113 is formed in the transistor area TrA of each of the first, second and third sub pixels SP1, SP2 and SP3 on the first substrate 110. The semiconductor layer 113 includes a first portion 113a at a center and second portions 113b at both sides of the first portion 113a. The first portion 113a of the semiconductor layer 113 becomes a channel of a thin film transistor. The second portions 113b of the semiconductor layer 113 have relatively high conductivity as compared with the first area 113a.

At this time, a buffer layer (not shown) may be formed between the semiconductor layer 113 and the first substrate 110 all over the first substrate 110. The buffer layer may be formed of an inorganic insulating material, for example, silicon oxide ($SiO_2$) or silicon nitride ($SiN_x$). The buffer layer prevents the properties of the semiconductor layer 113 from being lowered due to alkali ions from the inside of the first substrate 110.

A gate insulating layer 116 is formed all over the first substrate 110 and covers the semiconductor layer 113. A gate electrode 120 is formed on the gate insulating layer 116 and corresponds to the first portion 113a of the semiconductor layer 113.

In addition, a gate line (not shown) is formed on the gate insulating layer 116 in a first direction.

Next, an inter insulating layer 123 is formed on the gate electrode 120 and the gate line (not shown). The inter insulating layer 123 is formed of an inorganic insulating material such as silicon oxide ($SiO_2$) or silicon nitride ($SiN_x$), for example. The inter insulating layer 123 and the gate insulating layer 116 thereunder have semiconductor contact holes 125 respectively exposing the second portions 113b of the semiconductor layer 113.

A data line 130 and a power line (not shown) are formed on the inter insulating layer 123 having the semiconductor contact holes 125. The data line 130 crosses the gate line (not shown) to define a pixel region corresponding to each of the first, second and third sub pixel SP1, SP2 and SP3. The power line is spaced apart from the data line 130.

Additionally, source and drain electrodes 133 and 136 are formed on the inter insulating layer 123 in the transistor area TrA of each of the first, second and third sub pixel SP1, SP2 and SP3. The source and drain electrodes 133 and 136 are spaced apart from each other and contact the second portions 113b of the semiconductor layer 113 through the semiconductor contact holes 125.

In the meantime, the semiconductor layer 113, the gate insulating layer 116, the gate electrode, the inter insulating layer 123, and the source and drain electrodes 133 and 136 sequentially layered in the transistor area TrA constitute a thin film transistor DTr.

At this time, the thin film transistor DTr in the transistor area TrA substantially becomes a driving thin film transistor. A switching thin film transistor (not shown) having the same structure as the driving thin film transistor DTr may be formed in the transistor area TrA. The switching thin film transistor is connected to the gate line and the data line 130 and also connected to the driving thin film transistor DTr.

Meanwhile, in the OLED display device 101 according to the embodiment of the present invention, the semiconductor layer 113 may be formed of one of polycrystalline silicon, amorphous silicon and an oxide semiconductor material.

Each of the driving thin film transistor DTr (as shown in FIG. 5) and the switching thin film transistor (not shown) can be a top gate type. However, in an alternate embodiment, each of the driving thin film transistor and the switching thin film transistor may not be limited to the top gate type and may be a bottom gate type in which the gate electrode 120 is disposed under the semiconductor layer 113.

In the meantime, a first passivation layer 140 is formed on the driving thin film transistor DTr and the switching thin film transistor. The first passivation layer 140 is formed of an organic insulating material such as photo acryl, for example. The first passivation layer 140 has a flat top surface.

At this time, the first passivation layer 140 has a drain contact hole 143 exposing the drain electrode 136 of the driving thin film transistor DTr in the transistor area TrA of each of the first, second and third sub pixels SP1, SP2 and SP3.

Meanwhile, although only the first passivation layer 140 having the flat top surface is formed on the driving thin film transistor DTr and the switching thin film transistor as an example in the figure, a second passivation layer (not shown) may be further formed between the first passivation layer 140 and the driving and switching thin film transistors and/or formed on the first passivation layer 140. The second passivation layer may be formed of an inorganic insulating material such as silicon oxide ($SiO_2$) or silicon nitride (SiNx), for example. The second passivation layer of the inorganic insulating material may improve adhesion between adjacent layers.

In addition, a first electrode 147 is formed on the first passivation layer 140 in each of the first, second and third sub pixels SP1, SP2 and SP3. The first electrode 147 contacts the drain electrode 136 of the driving thin film transistor DTr through the drain contact hole 143. The first electrode 147 has a double-layered structure of an upper layer 147a and a lower layer 147b. The upper layer 147a may be formed of a transparent conductive material having a relatively high work function such as indium tin oxide (ITO), for example, and the lower layer 147b may be formed of a conductive material having a reflection property such as silver (Ag), for example. The lower layer 147b may have a relatively thin thickness. The materials of the first electrode 147 are not limited on these.

Meanwhile, in the OLED display device 101 according to the embodiment of the present invention, the first electrode 147 is connected to the drain electrode 136 of the driving thin film transistor DTr through the drain contact hole 150, for example. Alternatively, the first electrode 147 may be connected to the source electrode 133 of the driving thin film transistor DTr depending on a type of the thin film transistor. In this case, the drain contact hole 150 may be omitted, and a source contact hole can be formed in the first passivation layer 140 to expose the source electrode 133 of the driving thin film transistor DTr.

In the meantime, the first electrode 147 having the double-layered structure may have a different thickness in each of the first, second and third sub pixels SP1, SP2 and SP3 to implement the microcavity effect. At this time, the lower layers 147b of the first electrodes 147 in the first, second and third sub pixels SP1, SP2 and SP3, respectively, may have the same thickness and the upper layers 147a of the first electrodes 147 in the first, second and third sub pixels SP1, SP2 and SP3, respectively, may have different thicknesses. Alternatively, both the lower layers 147b and the upper layers 147a in the first, second and third sub pixels SP1, SP2 and SP3, respectively, may have different thicknesses.

The microcavity effect is to improve the brightness property by repeatedly reflecting light in a specific material layer and increasing the transmission efficiency of light. The microcavity effect is not implemented only by controlling the thickness of the first electrode 147. The microcavity effect may be implemented by controlling a thickness of a first auxiliary layer formed on the first electrode 147, and in this case, the first electrodes 147 in the first, second and third sub pixels SP1, SP2 and SP3, respectively, may have the same thickness.

Next, a bank 150 is formed between adjacent ones of the first, second and third sub pixels SP1, SP2 and SP3 along boundaries of the first, second and third sub pixels SP1, SP2 and SP3. The bank 150 overlaps edges of the first electrode 147. The bank 150 may be formed of an organic insulating material having a photosensitive property. The organic insulating material having the photosensitive property may be one of polyimide, photo acryl and benzocyclobutene (BCB), for example.

The bank 150 can have a lattice shape opening each of the sub pixels SP1, SP2 and SP3 in the display area and exposes central parts of the first electrodes 147.

An organic light emitting layer 155 is formed on the first electrode 147 in each of the sub pixels SP1, SP2 and SP3 surrounded by the bank 150. The organic light emitting layers 155 in the first, second and third sub pixels SP1, SP2 and SP3, respectively, may emit red, green and blue light.

In the meantime, a first auxiliary light emitting layer 152 is formed between the first electrode 147 and the organic light emitting layer 155 in each of the first, second and third sub pixels SP1, SP2 and SP3. The first auxiliary light emitting layer 152 may have a single-layered structure of a hole injection layer and a hole transporting layer or may have a double-layered structure of a hole injection layer and a hole transporting layer. In the figure showing one embodiment, the first auxiliary light emitting layer 152 has a single-layered structure of a hole transporting layer.

At this time, the first auxiliary light emitting layers 152a, 152b and 152c in the first, second and third sub pixels SP1, SP2 and SP3 may have different thicknesses t1, t2 and t3, respectively, such that the microcavity effect is implemented.

More precisely, in the OLED display device 101 according to the embodiment(s) of the present invention, the hole transporting layers 152a, 152b and 152c in the first, second and third sub pixels SP1, SP2 and SP3 have different thicknesses t1, t2 and t3, respectively, and thus the microcavity effect is implemented.

At this time, the hole transporting layer 152a in the first sub pixel SP1 where red light with a relatively long wavelength is emitted, beneficially, has the first thickness t1, and the hole transporting layers 152b and 152c in the second and third sub pixels SP2 and SP3 where green and blue light with relatively short wavelengths is emitted, beneficially, have the second and third thicknesses t2 and t3, respectively. In the figure, the first thickness t1 of the hole transporting layer 152a in the first sub pixel SP1 is thickest, and the third thickness t3 of the hole transporting layer 152c in the third sub pixel SP3 is thinnest. That is, the second thickness t2 is thinner than the first thickness t1 and thicker than the third thickness t3. However, the first, second and third thicknesses t1, t2 and t3 may be controlled such that the first thickness t1 of the hole transporting layer 152a in the first sub pixel SP1 is thinnest or the second thickness t2 of the hole transporting layer 152b in the second sub pixel SP2 is thinnest.

Meanwhile, in the OLED display device 101 according to the embodiment(s) of the present invention, the most stable properties of the device may be obtained by controlling the thickness of the first auxiliary light emitting layer 152, more precisely, the thicknesses t1, t2 and t3 of the hole transporting layers 152a, 152b and 152c, to implement the microcavity effect.

Moreover, a second auxiliary light emitting layer (not shown) may be formed on the organic light emitting layer 155. The second auxiliary light emitting layer may have a single-layered structure of an electron transporting layer or an electron injection layer or may have a double-layered structure of an electron transporting layer and an electron injection layer. The second auxiliary light emitting layer also may have a different thickness in each of the first, second and third sub pixels SP1, SP2 and SP3. The microcavity effect may be implemented by controlling the thickness of the first electrode 147 or the second auxiliary light emitting layer (not shown) on the organic light emitting layer 155. However, since holes are the major carriers in the OLED display device 101, the properties of the device are less affected by a change in the thicknesses of the hole transporting layers 152a, 152b and 152c, and thus the device with relatively stable properties may be obtained by controlling the thicknesses of the hole transporting layers 152a, 152b and 152c to implement the microcavity effect.

Next, a second electrode 158 is formed on the organic light emitting layer 155 all over the display area. If the second auxiliary light emitting layer is formed on the organic light emitting layer 155, the second electrode 158 may be disposed on the second auxiliary light emitting layer all over the display area. The second electrode 158 is formed of a metallic material having a relatively low work function to function as a cathode electrode. The metallic material may be silver (Ag), alloy of magnesium and silver (Mg:Ag), gold (Au), magnesium (Mg), copper (Cu) or calcium (Ca), and the second electrode 158 may include one or more metallic materials mentioned above. The material of the second electrode 158, however, is not limited to these materials.

In the meantime, the first and second electrodes 147 and 158 and the organic light emitting layer 155 therebetween constitute the organic light emitting diode E. If there are the first auxiliary light emitting layer 152 and the second auxiliary light emitting layer between the first and second electrodes 147 and 158, the organic light emitting diode E includes the first auxiliary light emitting layer 152 and the second auxiliary light emitting layer.

The second substrate 170 for encapsulation is spaced apart from and disposed over the first substrate 110 of the OLED display device 101 according to the embodiment of the present invention.

The first and second substrates 110 and 170 are attached by an adhesive (not shown) of sealant or frit, which is formed along edges of the first and second substrates 110 and 170, or attached by a face seal (not shown), which is formed all over the second substrate 170 to form a panel. The second substrate 170 for encapsulation may be formed of plastic, which is flexible, or may be formed of glass.

Meanwhile, the second substrate 170 may be omitted, and a film with an adhesive layer may be attached to the second electrode 158 of the first substrate 110.

In addition, an organic insulating layer or an inorganic insulating layer may be further formed on the second electrode 158, and the organic insulating layer or the inorganic insulating layer may function as a capping layer for improving the light extraction efficiency. In this case, the organic insulating layer or the inorganic insulating layer may be used as an encapsulation layer, and the second substrate 170 may be omitted.

In the meantime, the OLED display device 101 according to the embodiment(s) of the present invention is configured to minimize changes of the brightness and color coordinates according to the viewing angles.

Namely, the OLED display device 101 according to the embodiment(s) of the present invention includes the organic light emitting diode E, which comprises two electrodes disposed above and below and overlapping each other, i.e., the first electrode 147 and the second electrode 158, and the organic light emitting layer 155 between the electrodes 147 and 158. Moreover, in the OLED display device 101 according to the embodiment(s) of the present invention, to dispose the maximum peak at a curve of a color coordinate variation rate of the organic light emitting diode E within a range of viewing angles of −80 degrees to +80 degrees, the thickness of the organic light emitting diode E is optimized such that the main peak wavelength of light out-coupling between the electrodes 147 and 158 has a larger value than the main peak wavelength of light emitted from the organic light emitting layer 155 itself.

In this case, since the organic light emitting layers 155 in the sub pixels SP1, SP2 and SP3 emit different colors of red, green and blue, respectively, the thickness of the organic light emitting diode E may be optimized in each of the sub pixels SP1, SP2 and SP3 emitting red, green and blue, respectively.

At this time, the main peak wavelength of light out-coupling between the electrodes 147 and 158 may be determined on the basis of the main peak wavelength of light emitted from the organic light emitting layer 155 itself such that the maximum peak at the curve of the color coordinate variation rate of the organic light emitting diode E is disposed within a range of the viewing angles of −80 degrees to +80 degrees.

More specifically, in the OLED display device 101 according to the embodiment(s) of the present invention, the change of the color coordinate is minimized by appropriately controlling the main peak at a wavelength curve of photoluminescence light PL generated from the organic light emitting layer 155 itself, which may be referred to as the PL wavelength curve hereinafter, and the main peak at a wavelength curve of light out-coupling between the first electrode 147 and the second electrode 158, more particularly, between the lower layer 147b of the first electrode 147 and the second electrode 158, which may be referred to as the out-coupling wavelength curve hereinafter, due to the microcavity effect. The microcavity effect may be controlled by changing the thickness of the first electrode 147, the first auxiliary light emitting layer 152 or the second auxiliary light emitting layer (not shown).

A tendency of a variation of color coordinate according to the viewing angles varies depending on the positions of the main peak at the PL wavelength curve and the main peak at the out-coupling wavelength curve.

The tendency of the variation of the color coordinate according to the viewing angles will be described with reference to FIG. 6A and FIG. 6B. At this time, in the figures, a horizontal axis represents viewing angles, and a vertical axis represents a color coordinate variation rate (Δu'v') in the CIE 1976 chromaticity diagram.

As shown in the figures, the tendency of the variation of the color coordinate may be classified into two types.

Figure 6A:
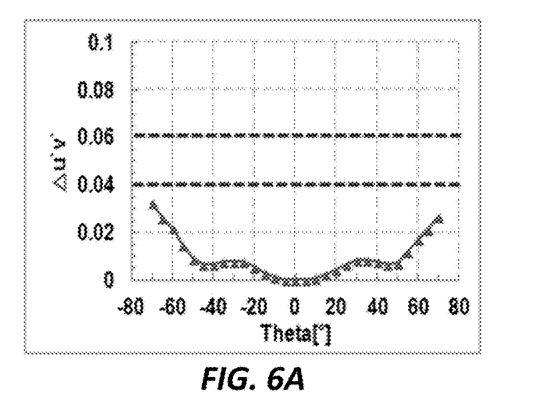
FIG. 6A and FIG. 6B are graphs showing a tendency of a variation of a color coordinate according to viewing angles.
Figure 6B:
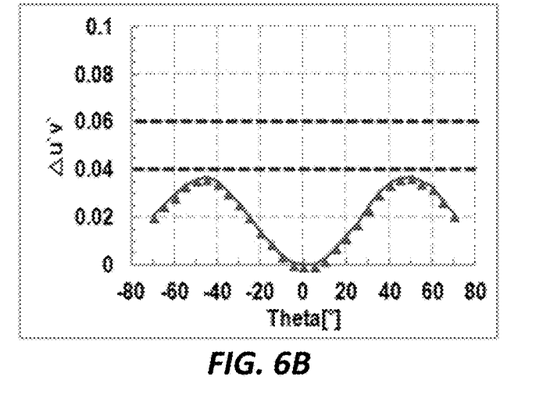

As shown in FIG. 6A, which is a graph showing the tendency of the variation of the color coordinate according to viewing angles and shows that the variation of the color coordinate occurs as a U-like shape, the first type is a U-like shaped type where the change of the color coordinate continuously increases as the viewing angle θ (Theta) increases. As shown in FIG. 6B, which is a graph showing the tendency of the variation of the color coordinate according to viewing angles and shows the variation of the color coordinate occurs as an M-like shape, the second type is an M-like shaped type where the change of the color coordinate increases and then decreases after the change of the color coordinate has the maximum value as the viewing angle θ (Theta) increases. In FIG. 6B, the change of the color coordinate may have the maximum value in the middle of the viewing angle, for example, around −50 degrees or +50 degrees.

The OLED display device according to the embodiment(s) of the present invention is configured to have the tendency of the M-like shaped type by controlling the main peak at the PL wavelength curve and the main peak at the out-coupling wavelength curve, and the variation of the color coordinate according to the viewing angles is minimized.

To do this, a distance between the main peak at the PL wavelength curve and the main peak at the out-coupling wavelength curve is controlled to be disposed within a range of −14 nm to −2 nm, and the color coordinate variation rate (Δu'v') has a value equal to or less than 0.043. At this time, the minus (−) sign in the distance between the main peak at the PL wavelength curve and the main peak at the out-coupling wavelength curve means that the main peak at the out-coupling wavelength curve is disposed at a right side of the main peak at the PL wavelength curve corresponding to a relatively long wavelength in the graph.

In the meantime, if the color coordinate variation rate (Δu'v') has a value more than 0.043, a user can notice the variation of the color sense. In this case, the user perceives the color shift according to the change of the viewing angles (Theta), and the display quality is lowered according to the change of the viewing angles (Theta). However, when the color coordinate variation rate (Δu'v') has a value equal to or less than 0.043, the user hardly notices the variation of the color sense even if the color shift occurs according to the change of the viewing angles (Theta), and thus it is prevented that the display quality is lowered due to the color shift according to the change of the viewing angles (Theta).

Meanwhile, it is beneficial that the distance between the main peak at the PL wavelength curve and the main peak at the out-coupling wavelength curve is disposed within a different range for each of the sub pixels including the organic light emitting layers emitting red, green and blue, respectively. That is, as a result of experiments, it is desirable that in the third sub pixel including the organic light emitting layer emitting blue, the distance between the main peak at the PL wavelength curve and the main peak at the out-coupling wavelength curve is disposed within a range of −4 nm to −2 nm and in the second sub pixel including the organic light emitting layer emitting green, the distance between the main peak at the PL wavelength curve and the main peak at the out-coupling wavelength curve is disposed within a range of −14 nm to −4 nm. At this time, within a range of the viewing angles (Theta) of −80 degrees to +80 degrees, the color coordinate variation rate (Δu'v') has a value equal to or less than 0.043 as the maximum value.

The range of the distance between the main peak at the PL wavelength curve and the main peak at the out-coupling wavelength curve and the color coordinate variation rate in the chromaticity diagram may be controlled by adjusting the thickness of one of the first electrode, the first auxiliary light emitting layer and the second auxiliary light emitting layer in each sub pixel, which may have a different thickness in each sub pixel to implement the microcavity effect.

This will be described in more detail with reference to FIGS. 7A to 7F and FIGS. 8A to 8E.

Figure 7A:
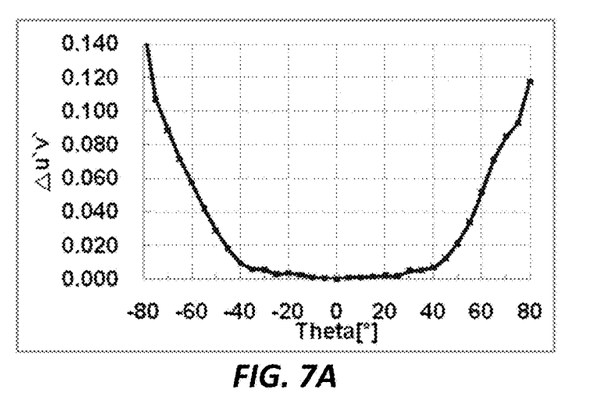
FIGS. 7A to 7F are views of showing the color coordinate variation rate according to the viewing angles for blue depending on the distance between the main peak at the PL wavelength curve and the main peak at the out-coupling wavelength curve.
Figure 7B:
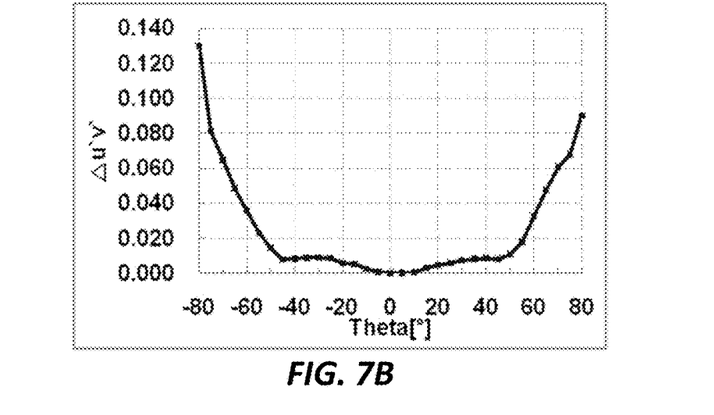
Figure 7C:
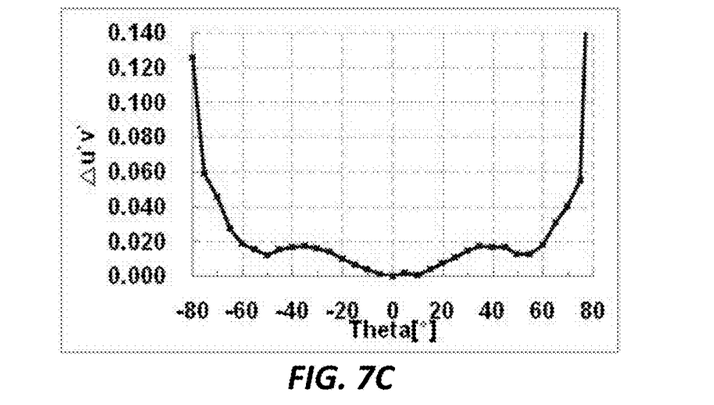
Figure 7D:
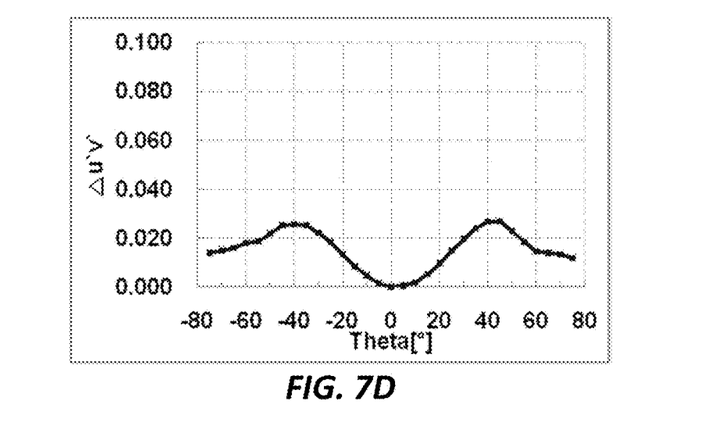
Figure 7E:
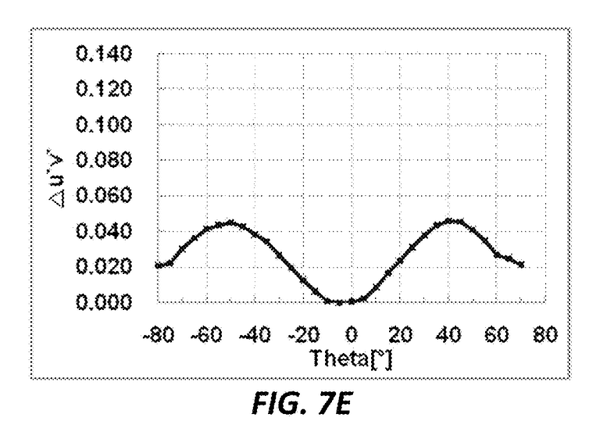
Figure 7F:
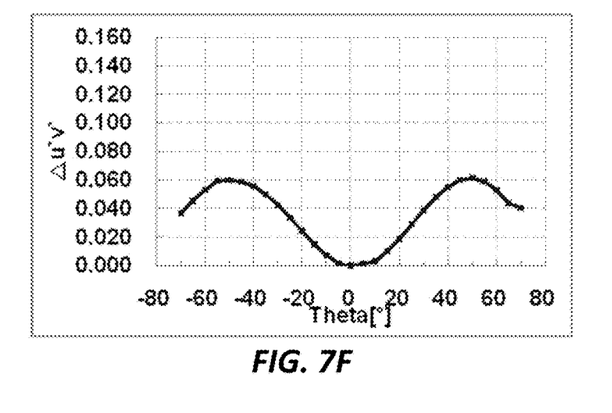

FIGS. 7A to 7F are views of showing the color coordinate variation rate according to the viewing angles (Theta) for blue depending on the distance between the main peak at the PL wavelength curve and the main peak at the out-coupling wavelength curve. FIGS. 7A to 7C show comparative examples having the variation of the color coordinate as a U-like shaped type where the distance between the main peak at the PL wavelength curve and the main peak at the out-coupling wavelength curve is disposed within a range of 0 nm to +8 nm. FIGS. 7D to 7E show exemplary examples having the variation of the color coordinate as an M-like shaped type where the distance between the main peak at the PL wavelength curve and the main peak at the out-coupling wavelength curve is disposed within a range of −4 nm to −2 nm. FIG. 7F shows another comparative example having the variation of the color coordinate as an M-like shaped type where the distance between the main peak at the PL wavelength curve and the main peak at the out-coupling wavelength curve is −6 nm and having the maximum value of the variation of the color coordinate more than 0.043.

First, referring to FIG. 7A, as for blue, when the distance between the main peak at the PL wavelength curve and the main peak at the out-coupling wavelength curve, i.e., the value of subtracting the value of the main peak of the out-coupling wavelength curve from the value of the main peak of the PL wavelength curve is +8 nm, in the chromaticity diagram, the color coordinate variation rate (Δu'v') increases as the viewing angle (Theta) increases toward a negative (−) or positive (+) direction with respect to 0 degree, and the curve of FIG. 7A is a U-like shaped type.

Referring to FIGS. 7B and 7C, which have +6 nm and 0 nm as the distances between the main peak at the PL wavelength curve and the main peak at the out-coupling wavelength curve, respectively, the color coordinate variation rate in each of the curves of FIGS. 7B and 7C has inflection points within a range of +30 degrees to +40 degrees and within a range of −40 degrees to −30 degrees. However, the color coordinate variation rate increases again as the viewing angle (Theta) increases with respect to ±45 degrees or ±50 degrees, and the curves of FIGS. 7B and 7C are finally a U-like shaped type.

On the other hand, in the OLED display device according to the embodiment(s) of the present invention, referring to FIG. 7D, when the distance between the main peak at the PL wavelength curve and the main peak at the out-coupling wavelength curve is −2 nm, the color coordinate variation rate has the maximum values around ±40 degrees, and referring to FIG. 7E, when the distance between the main peak at the PL wavelength curve and the main peak at the out-coupling wavelength curve is −4 nm, the color coordinate variation rate has the maximum values around −48 degrees and +40 degrees. After that, the color coordinate variation rate decreases as the viewing angle (Theta) increases, and thus the curves of FIGS. 7D and 7E are an M-like shaped type.

Accordingly, it is noted that in the OLED display device according to the embodiment(s) of the present invention, as for blue, the distance between the main peak at the PL wavelength curve and the main peak at the out-coupling wavelength curve is disposed within a range of −4 nm to −2 nm and the maximum value of the color coordinate variation rate is equal to or less than 0.043.

Meanwhile, referring to FIG. 7F, in the comparative example where the distance between the main peak at the PL wavelength curve and the main peak at the out-coupling wavelength curve is −6 nm, the color coordinate variation rate in the chromaticity diagram has the maximum value with respect to ±50 degrees and then decreases as the viewing angle (Theta) increases, and thus the curve of FIG. 7F is an M-like shaped type. However, the color coordinate variation rate (Δu'v') has the maximum value of 0.061 greater than 0.043, which is the minimum value of the variation of the color coordinate in a case that the user notices the color shift. In this comparative example, although the curve of the color coordinate variation rate according to the viewing angles has an M-like shape, the maximum value of the color coordinate variation rate is too large, and the user can notice the color shift. Therefore, the display quality is lowered, and the comparative example goes beyond the range of the conditions of the OLED display device according to the present invention.

Table 1 shows changes of the distance between the main peak at the PL wavelength curve and the main peak at the out-coupling wavelength curve, which is expressed by Position 1, 2, 3, 4, 5, or 6, when the thickness of the first auxiliary light emitting layer, i.e., the hole transporting layer varies in the sub pixels to implement the microcavity effect in the OLED display devices according to the exemplary examples and the comparative examples of the present invention.

TABLE 1

|  | main peak (nm) | Δλ (PL1-Position) | thickness (nm) |
| --- | --- | --- | --- |
| PL1 | 464 | — | — |
| Position 1 | 456 | 8 | 95 |
| Position 2 | 458 | 6 | 97 |
| Position 3 | 464 | 0 | 98 |
| Position 4 | 466 | −2 | 99 |
| Position 5 | 468 | −4 | 100 |
| Position 6 | 470 | −6 | 102 |

Referring to Table 1, it is noted that the distance between the main peak at the PL wavelength curve and the main peak at the out-coupling wavelength curve varies depending on the thickness of the first auxiliary light emitting layer, for example, the hole transporting layer, which has a different thickness in each sub pixel for implementing the microcavity effect. Particularly, in the third sub pixel in which the main peak wavelength is 464 nm and blue is shown, the hole transporting layer, beneficially, has the thickness of 99 nm to 100 nm such that the distance between the main peak at the PL wavelength curve and the main peak at the out-coupling wavelength curve is within a range of −4 nm to −2 nm.

Meanwhile, in Table 1, the main peak at the PL wavelength curve of the organic light emitting layer emitting blue is 464 nm, for example. Alternatively, the main peak at the PL wavelength curve of the organic light emitting layer emitting blue may be within a range of 450 nm to 480 nm. In the case that the main peak at the PL wavelength curve of the organic light emitting layer emitting blue is within a range of 450 nm to 480 nm, it is experimentally noted that the hole transporting layer has the thickness of 99 nm to 100 nm when the distance between the main peak at the PL wavelength curve and the main peak at the out-coupling wavelength curve is within a range of −4 nm to −2 nm.

FIGS. 8A to 8E are views of showing the color coordinate variation rate according to the viewing angles (Theta) for green depending on the distance between the main peak at the PL wavelength curve and the main peak at the out-coupling wavelength curve. FIG. 7A shows a comparative example having the variation of the color coordinate as a U-like shaped type where the distance between the main peak at the PL wavelength curve and the main peak at the out-coupling wavelength curve is 0 nm. FIGS. 8B to 8E show exemplary examples having the variation of the color coordinate as an M-like shaped type where the distance between the main peak at the PL wavelength curve and the main peak at the out-coupling wavelength curve is disposed within a range of −14 nm to −4 nm.

Figure 8A:
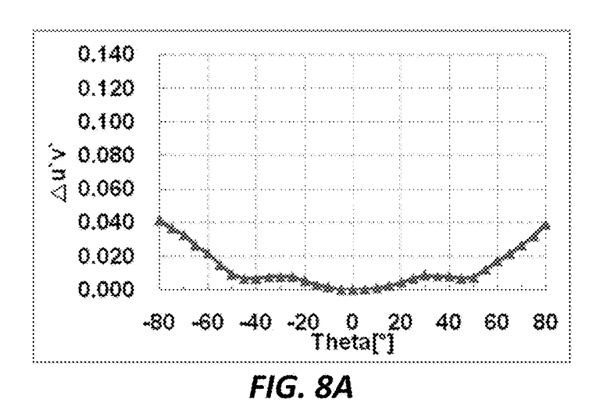
FIGS. 8A to 8E are views of showing the color coordinate variation rate according to the viewing angles for green depending on the distance between the main peak at the PL wavelength curve and the main peak at the out-coupling wavelength curve.

First, referring to FIG. 8A, as for green, the distance between the main peak at the PL wavelength curve and the main peak at the out-coupling wavelength curve, i.e., the value of subtracting the value of the main peak of the out-coupling wavelength curve from the value of the main peak of the PL wavelength curve is 0 nm. That is, the main peak at the out-coupling wavelength curve accords with the main peak at the PL wavelength curve. At this time, the color coordinate variation rate has inflection points around ±30 degrees and then increases as the viewing angle (Theta) increases toward negative (−) and positive (+) directions with respect to ±50 degrees, and the curve of FIG. 8A is finally a U-like shaped type.

Although not shown in the figure, as for green, when the distance between the main peak at the PL wavelength curve and the main peak at the out-coupling wavelength curve has the value more than 0 nm, the color coordinate variation rate according to the viewing angles (Theta) has a curve of the U-like shaped type without inflection points.

On the other hand, referring to FIGS. 8B to 8E, in each OLED display device according to the embodiment(s) of the present invention where the distance between the main peak at the PL wavelength curve and the main peak at the out-coupling wavelength curve for green is within a range of −14 nm to −4 nm, the color coordinate variation rate has a curve of an M-like shaped type.

Figure 8B:
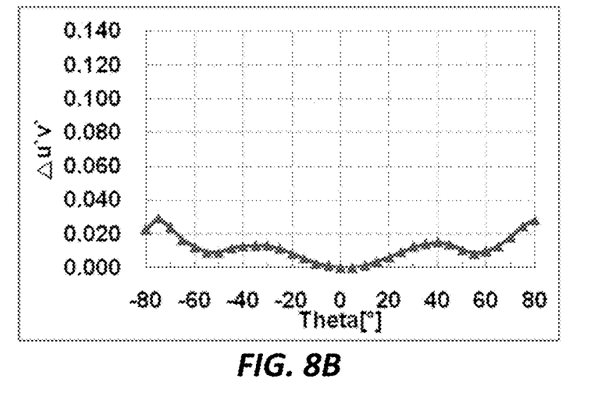

Namely, in the OLED display device according to the embodiment(s) of the present invention, referring to FIG. 8B, when the distance between the main peak at the PL wavelength curve and the main peak at the out-coupling wavelength curve for green is −4 nm, the color coordinate variation rate has the first peak around the viewing angles (Theta) of −30 degrees and +40 degrees and the second peak around the viewing angles (Theta) of −75 degrees and +80 degrees.

In this case, the curve of the color coordinate variation rate does not have the accurate M-like shape. However, the curve of FIG. 8B is similar to the M-like shape because the color coordinate variation rate decreases within a range of the viewing angles (Theta) less than −80 degrees and more than +80 degrees differently from the comparative example where the color coordinate variation rate increases as the viewing angle (Theta) increases toward the positive (+) or negative direction with respect to the inflection points corresponding to the values of the first peak.

Figure 8C:
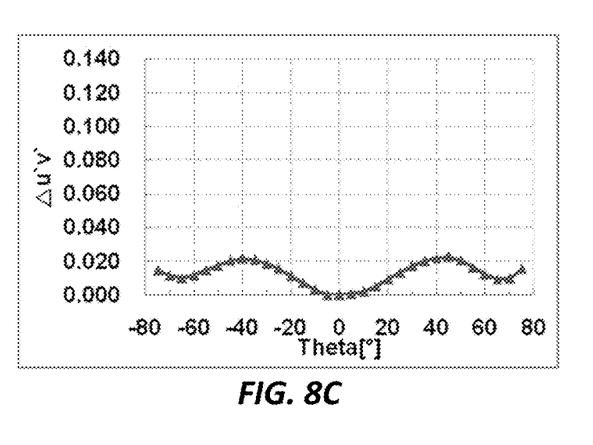

In addition, in the OLED display device according to the embodiment(s) of the present invention, referring to FIG. 8C, when the distance between the main peak at the PL wavelength curve and the main peak at the out-coupling wavelength curve is −8 nm, the color coordinate variation rate has the values of the maximum peak around the viewing angles (Theta) of ±40 degrees and then decreases as the viewing angle (Theta) increases. At this time, the inflection points are shown around −65 degrees and +68 degrees, and the color coordinate variation rate increases again within a range of the viewing angles (Theta) less than −65 degrees and more than +68 degrees. However, the color coordinate variation rate is within a range less than 0.040 when the viewing angle (Theta) is within a range of −80 degrees to +80 degrees, and there is no color shift that the user can notice. Therefore, the curve of FIG. 8C is also similar to the M-like shape.

Figure 8D:
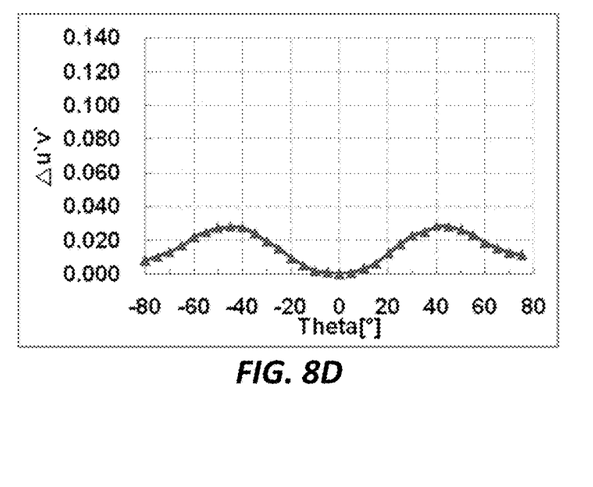
Figure 8E:
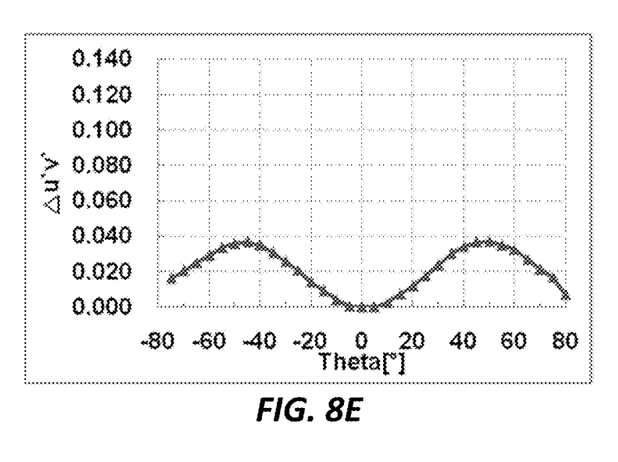

Meanwhile, in the OLED display device according to the embodiment(s) of the present invention, referring to FIG. 8D, when the distance between the main peak at the PL wavelength curve and the main peak at the out-coupling wavelength curve for green is −10 nm, the color coordinate variation rate has the maximum values around ±40 degrees, and referring to FIG. 8E, when the distance between the main peak at the PL wavelength curve and the main peak at the out-coupling wavelength curve for green is −14 nm, the color coordinate variation rate has the maximum values around ±45 degrees. After that, the color coordinate variation rate decreases as the viewing angle (Theta) increases toward the negative (−) or positive (+) direction. Thus, the curves of FIGS. 8D and 8E are an M-like shaped type when the distance between the main peak at the PL wavelength curve and the main peak at the out-coupling wavelength curve for green is within a range of −14 nm to −10 nm.

It is noted that in the OLED display device according to the embodiment(s) of the present invention, as for green, the distance between the main peak at the PL wavelength curve and the main peak at the out-coupling wavelength curve is disposed within a range of −14 nm to −4 nm and the maximum value of the color coordinate variation rate is equal to or less than 0.040.

Table 2 shows changes of the distance between the main peak at the PL wavelength curve and the main peak at the out-coupling wavelength curve, which is expressed by Position 7, 8, 9, 10, or 11, when the thickness of the first auxiliary light emitting layer, more precisely, the hole transporting layer, varies in the sub pixels to implement the microcavity effect in the OLED display devices according to the exemplary examples and the comparative example of the present invention.

TABLE 2

|  | main peak (nm) | Δλ (PL2-Position) | thickness (nm) |
| --- | --- | --- | --- |
| PL2 | 532 | — | — |
| Position 7 | 532 | 0 | 95 |
| Position 8 | 536 | −4 | 97 |
| Position 9 | 540 | −8 | 98 |
| Position 10 | 542 | −10 | 99 |
| Position 11 | 546 | −14 | 100 |

Referring to Table 2, it is noted that the distance between the main peak at the PL wavelength curve and the main peak at the out-coupling wavelength curve varies depending on the thickness of the first auxiliary light emitting layer, for example, the hole transporting layer, which has a different thickness in each sub pixel for implementing the microcavity effect. Particularly, in the second sub pixel in which the main peak wavelength is 532 nm and green is shown, the hole transporting layer, beneficially, has the thickness of 97 nm to 100 nm such that the distance between the main peak at the PL wavelength curve and the main peak at the out-coupling wavelength curve is within a range of −14 nm to −4 nm.

Meanwhile, in Table 2, the main peak at the PL wavelength curve of the organic light emitting layer emitting green is 532 nm, for example. Alternatively, the main peak at the PL wavelength curve of the organic light emitting layer emitting green may be within a range of 520 nm to 580 nm. In the case that the main peak at the PL wavelength curve of the organic light emitting layer emitting green is within a range of 520 nm to 580 nm, it is experimentally noted that the hole transporting layer has the thickness of 97 nm to 100 nm when the distance between the main peak at the PL wavelength curve and the main peak at the out-coupling wavelength curve is within a range of −14 nm to −4 nm.

The organic light emitting diode and the OLED display device including the same according to the embodiment(s) of the present invention have an effect of improving the display quality according to the change of the viewing angles because the shift of the color coordinate decreases according to the change of the viewing angles in comparison with the related art OLED display device for implementing the microcavity effect.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode in each of red, green and blue sub pixels, comprising:
   a first electrode and a second electrode;
   an organic light emitting layer between the first electrode and the second electrode; and
   an auxiliary light emitting layer between the first electrode and the organic light emitting layer or between the organic light emitting layer and the second electrode,
   wherein a difference between a main peak wavelength of light emitted from the organic light emitting layer itself and a main peak wavelength of light out-coupling between the first and second electrodes is within a range of −14 nm to −2 nm,
   wherein the main peak wavelength of light out-coupling between the first and second electrodes has a larger value than the main peak wavelength of light emitted from the organic light emitting layer itself in each of the green and blue sub pixels, and
   wherein a value of a maximum peak at a curve of a color coordinate variation rate (Δu'v') of the organic light emitting diode is equal to or less than 0.043 within a range of viewing angles of −80 degrees to +80 degrees.

2. The organic light emitting diode according to claim 1, wherein the curve of the color coordinate variation rate (Δu'v') of the organic light emitting diode has an M-like shape within the range of viewing angles of −80 degrees to +80 degrees.

3. The organic light emitting diode according to claim 1, wherein the organic light emitting layer is a green organic light emitting layer, and the difference between the main peak wavelength of light emitted from the green organic light emitting layer itself and the main peak wavelength of light out-coupling between the first and second electrodes is within a range of −14 nm to −4 nm.

4. The organic light emitting diode according to claim 3, wherein the main peak wavelength of light emitted from the green organic light emitting layer itself is within a range of 520 nm to 580 nm.

5. The organic light emitting diode according to claim 4, wherein the value of the maximum peak at the curve of a color coordinate variation rate (Δu'v') of the organic light emitting diode is equal to or less than 0.040 within the range of viewing angles of −80 degrees to +80 degrees.

6. The organic light emitting diode according to claim 5, wherein the auxiliary light emitting layer is a hole transporting layer, and the hole transporting layer has a thickness within a range of 97 nm to 100 nm.

7. The organic light emitting diode according to claim 1, wherein the organic light emitting layer is a blue organic light emitting layer, and the difference between the main peak wavelength of light emitted from the blue organic light emitting layer itself and the main peak wavelength of light out-coupling between the first and second electrodes is within a range of −4 nm to −2 nm.

8. The organic light emitting diode according to claim 7, wherein the main peak wavelength of light emitted from the blue organic light emitting layer itself is within a range of 450 nm to 480 nm.

9. The organic light emitting diode according to claim 8, wherein the auxiliary light emitting layer is a hole transporting layer, and the hole transporting layer has a thickness within a range of 99 nm to 100 nm.

10. A display device, comprising:
   an organic light emitting diode including two electrodes and an organic light emitting layer therebetween in each of red, green and blue sub pixels,
   wherein, to dispose a maximum peak at a curve of a color coordinate variation rate (Δu'v') of the organic light emitting diode within a range of viewing angles of −80 degrees to +80 degrees, a thickness of the organic light emitting diode is optimized such that a main peak wavelength of light out-coupling between the two electrodes has a larger value than a main peak wavelength of light emitted from the organic light emitting layer itself in each of the green and blue sub pixels, and
   wherein the curve of the color coordinate variation rate (Δu'v') of the organic light emitting diode has an M-like shape within the range of viewing angles of −80 degrees to +80 degrees.

11. The display device according to claim 10, wherein the main peak wavelength of light out-coupling between the two electrodes is determined on a basis of the main peak wavelength of light emitted from the organic light emitting layer itself such that the maximum peak at the curve of the color coordinate variation rate (Δu'v') of the organic light emitting diode is disposed within the range of viewing angles of −80 degrees to +80 degrees.

12. The display device according to claim 10, wherein a difference between the main peak wavelength of light emitted from the organic light emitting layer itself and the main peak wavelength of light out-coupling between the two electrodes is within a range of −14 nm to −2 nm.

13. The display device according to claim 12, wherein the main peak wavelength of light emitted from the organic light emitting layer itself is within a range of 520 nm to 580 nm, and a value of the maximum peak at the curve of the color coordinate variation rate (Δu'v') of the organic light emitting diode is equal to or less than 0.040 within the range of viewing angles of −80 degrees to +80 degrees.

14. The display device according to claim 12, wherein the main peak wavelength of light emitted from the organic light emitting layer itself is within a range of 450 nm to 480 nm, and a value of the maximum peak at the curve of the color coordinate variation rate (Δu'v') of the organic light emitting diode is equal to or less than 0.043 within the range of viewing angles of −80 degrees to +80 degrees.

* * * * *